United States Patent [19]
Komatsu

[11] Patent Number: 5,383,156
[45] Date of Patent: Jan. 17, 1995

[54] SEMICONDUCTOR DEVICE FOR PERMITTING EASY EXTERNAL DETECTION OF USE OF REDUNDANT CIRCUIT AND SEMICONDUCTOR MEMORY DEVICE THEREFORE

[75] Inventor: Takahiro Komatsu, Hyogo, Japan

[73] Assignee: Mitsubishi Denki Kabushiki Kaisha, Tokyo, Japan

[21] Appl. No.: 136,841

[22] Filed: Oct. 18, 1993

[30] Foreign Application Priority Data

Mar. 23, 1993 [JP] Japan .................. 5-063573

[51] Int. Cl.$^6$ .............................. G11C 7/00
[52] U.S. Cl. ......................... 365/200; 365/225.7; 365/230.06
[58] Field of Search ............. 365/200, 230.06, 225.7; 371/10.2, 10.3

[56]    References Cited
U.S. PATENT DOCUMENTS

| | | | |
|---|---|---|---|
| 4,480,199 | 10/1984 | Varshney et al. | 365/200 X |
| 4,567,580 | 1/1986 | Varshney | 365/200 |
| 4,757,474 | 7/1988 | Fukushi et al. | 365/200 |
| 4,862,416 | 8/1989 | Takeuchi | 365/200 X |
| 4,984,205 | 1/1991 | Sugibayashi | 365/200 |
| 5,034,925 | 7/1991 | Kato | 365/200 |

FOREIGN PATENT DOCUMENTS 62-22300   1/1987   Japan .

Primary Examiner—Joseph A. Popek
Attorney, Agent, or Firm—Lowe, Price, LeBlanc & Becker

[57] ABSTRACT

A dynamic random access memory includes an improved redundant use detection circuit, a redundant fuse circuit for programming a defective row, and a redundant enable circuit for enabling the redundant fuse circuit. Redundant use detection circuit includes a switching element responsive to a redundant use signal from the redundant enable circuit for conducting. High voltage is applied through an external terminal in a redundant use detection mode, and use of a redundant circuit is detected by the presence of current flowing into the redundant use detection circuit. Since a fuse element is not necessary in the redundant use detection circuit, integration density is further improved, thus permitting easy detection of use of a redundant circuit as well.

19 Claims, 12 Drawing Sheets

SEMICONDUCTOR DEVICE FOR PERMITTING EASY EXTERNAL DETECTION OF USE OF REDUNDANT CIRCUIT AND SEMICONDUCTOR MEMORY DEVICE THEREFORE

BACKGROUND OF THE INVENTION

1. Field of the Invention

The present invention relates generally to semiconductor devices and semiconductor memory devices, and more specifically, to a semiconductor device and a semiconductor memory device permitting use of a redundant circuit to be easily detected externally.

The invention has particular applicability to Dynamic Random Access Memories (DRAMs).

2. Description of the Background Art

In recent years, higher reliability in manufacturing has been in demand, as the integration density of semiconductor integrated circuit devices increases. Meanwhile, in order to improve yield in manufacturing of semiconductor integrated circuit devices, a redundant circuit is generally provided in a semiconductor integrated circuit device. Particularly, semiconductor memories such as Dynamic Random Access Memories (hereinafter referred to as "DRAMs") and Static Random Access Memories (hereinafter referred to as "SRAMs") which have high integration densities for achieving large storage capacities are provided with redundant circuits.

Generally, a redundant circuit is provided in a semiconductor integrated circuit device to functionally replace a defective circuit found in the device. More specifically, the redundant circuit is activated by fusing a fuse element provided in the semiconductor integrated circuit device, so that the redundant circuit is operated in place of the defective circuit.

When the presence of some failure is recognized in the semiconductor integrated circuit device, the position (or location) of the failure must be specified. The operation of locating the failure, however, would be different depending upon if the redundant circuit is activated or not. Accordingly, it is necessary to externally detect the presence/absence of activation (or use) of the redundant circuit. The following conventional techniques are known for this purpose.

FIG. 20 is a diagram showing one example of a conventional redundant use detection circuit. Referring to FIG. 20, redundant use detection circuit 58 is connected to some input terminal or a predetermined input terminal 37. Redundant use detection circuit 58 includes a fuse element FS, and NMOS transistors Q31 and Q32 connected in series between terminal 37 and ground potential. Transistors Q31 and Q32 are each provided in a diode-connected manner.

When a redundant circuit (not shown) is not being used, in other words when the redundant circuit is not activated, fuse element FS is left. Meanwhile, when the redundant circuit is being used, in other words when the redundant circuit is activated, fuse FS is fused by externally applied voltage or a laser beam.

Therefore, detection of the presence/absence of use of such a redundant circuit can be conducted by applying high voltage to terminal 37. More specifically, high voltage is supplied to terminal 37 from a high voltage source 142, and an amperemeter 141 detects the presence of current flowing cross terminal 37 and detects use of the redundant circuit. For the high voltage, a voltage level enough for turning on transistors Q31 and Q32 each of which operates as a diode is selected.

When, for example, the redundant circuit is not being used, current flows across fuse element FS, and transistors Q31 and Q32 by supplying high voltage. Meanwhile, if the redundant circuit is used, since fuse element FS is cut off, current does not flow across terminal 37. Accordingly, one can know the presence of current flowing across terminal 37 using amperemeter 141. In other words, the presence/absence of the use of the redundant circuit can be externally known using amperemeter 141.

FIG. 21 is a diagram showing another example of a conventional redundant use detection circuit. Redundant use detection circuit 59 shown in FIG. 21 is disclosed in U.S. Pat. No. 4,480,199. Also in this redundant use detection circuit 59, high voltage is applied across an external terminal TTLPN, and different current flows by connecting or disconnecting fuse element FS. Fuse element FS shown in FIG. 21 is left or disconnected based on the presence/absence of the use of the redundant circuit, and therefore the present/absence of the use of the redundant circuit can be detected by detecting the presence/absence of current flowing across external terminal TTLP$_{IN}$.

FIG. 23 is a block diagram showing a semiconductor memory using a conventional redundant use detection circuit. The circuit shown in FIG. 23 is disclosed in Japanese Patent Laying-Open No. 62-22300.

Referring to FIG. 23, a memory cell array 101 includes memory cells MC connected between bit lines 103 and 104. A memory cell MC is selected in response to an activation signal on a word line 102. A redundant memory cell column 105 is provided at an end of memory cell array 105. Redundant memory cell column 105 also includes memory cells connected to bit lines and word lines.

Address buffers 111 to 11n receive externally applied address signals Aa to An. Program elements 131 to 13n are provided for programming address in a defective memory cell column. A Y decoder 108 decodes address signals Aa to An, and selects one column to be accessed through a selector circuit 104. A data signal read out from a memory cell is output through an output buffer 107.

A redundant use detection circuit 60 includes NMOS transistors 121, 122, and 125, and a high resistance element 123. An amperemeter 141 and a high voltage source 142 are connected between an external terminal 126 and ground potential.

If a defective memory cell column is present in memory cell array 101, the address of the defective memory cell column is programmed by selectively disconnecting program elements 131 to 13n. Accordingly, when address signals Aa to An requesting accessing to the defective memory cell column are externally applied, program elements 131 to 13n output a signal SR for selecting a redundant memory cell column. Signal SR is also applied to redundant use detection circuit 60. Transistor 121 receives signal SR through a gate electrode.

The presence/absence of use of the redundant circuit in the semiconductor memory shown in FIG. 23 is detected externally as in the following manner. Amperemeter 141 and high voltage source 142 are connected to external terminal 126. Then, address signals Aa to An which sequentially change are applied through address buffers 111 to 11n. Assuming that the address of the defective memory cell column is programmed by selectively disconnecting program elements 131 to 13n, when address signals Aa–An requesting accessing to the defective memory column are applied, redundant memory cell column access signal SR is output from program elements 131 to 13n.

In response to signal SR, transistor 131 is turned off, while transistor 122 is turned on. Therefore, current flows from high voltage source 141 across terminal 126, transistors 125 and 122 toward power supply $V_{DD}$. The use of the redundant circuit can be detected by detecting this current using amperemeter 141.

Meanwhile, if the redundant circuit is not being used, redundant memory cell column selection signal SR is not output from program elements 131 to 13n, if any of address signals Aa to An is applied. Transistor 121 therefore continues to conduct, while transistor 122 continues to be off. As described above, since resistance element 123 has a high resistance value and transistor 122 is turned off, current does not flow across terminal 126, which can be detected through amperemeter 141.

FIG. 22 is a diagram showing a further example of a conventional redundant use detection circuit. The above-described Japanese Patent Laying-Open No. 62-22300 discloses that a redundant use detection circuit 61 shown in FIG. 22 can be used in place of redundant use detection circuit 60 shown in FIG. 23. Redundant use detection circuit 61 uses a capacitor 127 in place of resistance element 123 shown in FIG. 23. Use of circuit 61 also permits detection of the presence/absence of use of a redundant circuit as in the case of circuit 60 shown in FIG. 23.

Use of redundant use detection circuits 58 to 61 shown in FIGS. 20 to 23 in a semiconductor integrated circuit device is however encountered with the following disadvantage.

Redundant use detection circuits 58 and 59 shown in FIGS. 20 and 21 each include fuse element FS for indicating the presence/absence of use of a redundant circuit. More specifically, not only a fuse element for programming in the redundant circuit, but also such an additional fuse element FS is provided in redundant use detection circuits 58 and 59. Generally, when a fuse element is fused, the peripheral circuitry is adversely affected by thermal damages and spreading of fused material. Accordingly, in order to prevent such adverse effects, in design, other wirings and transistors are not provided in a circle with the radius of about 10 μm around a fuse element. Stated differently, providing a fuse element indicating the presence/absence of use of a redundant circuit impairs high density integration.

In addition, when fuse element FS is left in redundant use detection circuits 58 and 59 shown in FIGS. 20 and 21, very small current flows across the fuse element. More specifically, even when high voltage for testing is not applied in a normal operation, current does flow into redundant use detection circuits 58 and 59. This means an additional load for another semiconductor integrated circuit device connected to external terminal 37 (or TTLP$_{IN}$).

Furthermore, when redundant use detection circuits 60 and 61 shown in FIGS. 22 and 23 are used, address signals Aa to An to specify all the memory cell columns should be sequentially applied in order detect the presence/absence of use of the redundant circuit. Therefore, a long time period and supply of complicated control signals are necessary for detecting the presence/absence of use of the detection circuit.

It is one object of the invention to improve integration density in a semiconductor device and a semiconductor memory device permitting external detection of use of a redundant circuit.

Another object of the invention is to reduce current flowing across an external terminal in a normal operation mode in a semiconductor device and a semiconductor memory device permitting external detection of use of a redundant circuit.

A still further object of the invention is to reduce a time period necessary for detecting use of redundant circuit in a semiconductor device and semiconductor memory device permitting external detection of use of a redundant circuit.

SUMMARY OF THE INVENTION

A semiconductor device according to the invention in one aspect, includes a program circuit for programming the position of a defective circuit, a redundant circuit for functionally replacing the defective circuit in response to an output signal from the program circuit, an activation circuit for activating the program circuit, a predetermined external terminal, and a switching circuit connected between the external terminal and a power supply potential and conducting in response to an output signal from the activation circuit.

In operation, use of a redundant circuit is determined by the activation circuit for the program circuit. Since the switching circuit conducts in response to an output signal from the activation circuit, the use of the redundant circuit can easily be detected by supplying voltage to the external terminal. In addition, since a fuse element for detecting use of a redundant circuit is not necessary, integration density can be improved.

According to another aspect of the invention, a semiconductor device includes a memory cell array including a plurality of memory cells arranged in rows and columns, a program circuit for programming the address of a defect in the memory cell array, a redundant circuit for functionally replacing the defect in the memory cell array in response to an output signal from the program circuit, an activation circuit for activating the program circuit, a predetermined external terminal, and a switching circuit connected between the external terminal and a power supply potential and conducting in response to an output signal from the activation circuit.

In operation, use of a redundant circuit is determined by the activation circuit for the program circuit. Since the switching circuit conducts in response to an output signal from the activation circuit, the use of the redundant circuit can easily be detected by supplying voltage to the external terminal. In addition, since a fuse element for detecting use of a redundant circuit is not necessary, integration density can be improved.

According to a still further aspect of the invention, a semiconductor memory device further includes a redundant use detection mode defining circuit for defining a redundant use detection mode in a semiconductor memory device in response to an externally applied control signal.

In operation, since the switching circuit conducts only in the redundant use detection mode, in response to an output signal from the redundant use detection mode defining circuit, current can be prevented from flowing across the switching circuit in operation modes other than the redundant use detection mode. Accordingly, increase of loads for another device connected to the external terminal can be avoided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Applications of the present invention to DRAMs will be described by way of illustration below but the invention is not only applicable thereto but is generally applicable to semiconductor integrated circuit devices including a redundant circuit.

Figure 1:
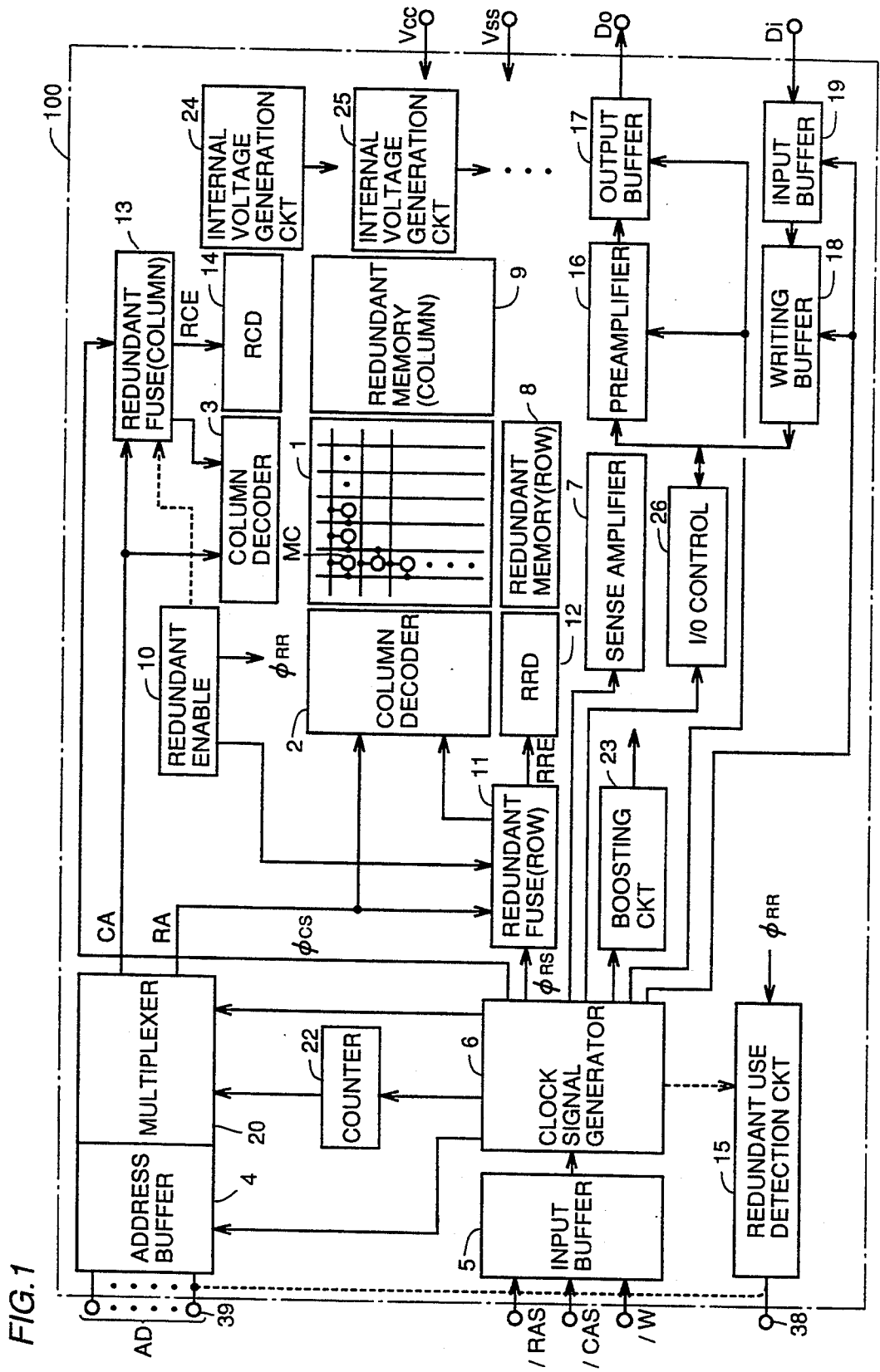
FIG. 1 is a block diagram showing a DRAM according to one embodiment of the invention.

Referring to FIG. 1, DRAM 100 includes a memory cell array 1 including a plurality of memory cells MC arranged in rows and columns. An address buffer 4 receives an externally applied address signal AD. Address signal AD includes a row address signal RA and a column address signal CA in a time dividing manner. Row address signal RA is applied to a row decoder 2. Column address signal CA is applied to a column decoder 3.

Row decoder 2 responds to row address signal RA and selectively activates a word line in memory cell array 1. Meanwhile, column decoder 3 responds to column address signal CA and selects a column in memory cell array 1.

DRAM 100 further includes a redundant memory cell row 8 and a redundant memory cell column 9 provided at an end of memory cell array 1. One of redundant memory cell row 8 and redundant memory cell column 9 is provided in some cases. Redundant memory cell row 8 is accessed in response to an output signal from a redundant row decoder (RRD) 12. Meanwhile, redundant memory cell column 9 is accessed in response to an output signal from a redundant column decoder (RCD) 14.

A data signal read out from a memory cell MC addressed by row decoder 2 and column decoder 3 is amplified by a sense amplifier 7. The amplified data signal is externally output as output data Do through a preamplifier 16 and an output buffer 17. Meanwhile, input data Di is input through an input buffer 19 and a writing buffer 18.

A clock signal generator 6 receives a row address strobe signal $\overline{RAS}$, a column address strobe signal $\overline{CAS}$, and a write enable signal $\overline{W}$. Clock signal generator 6 responds to these state control signals $\overline{RAS}$, $\overline{CAS}$ and $\overline{W}$, and supplies clock signals for control to internal circuits in DRAM 100.

DRAM 100 further includes a redundant fuse circuit (row) 11 for programming the address of a defective memory cell row, and a redundant fuse circuit (column) 13 for programming the address of a defective memory cell column. Redundant enable circuit 10 outputs a redundant enable signal RE for enabling redundant fuse circuits 11 and 13. Redundant fuse circuits 11 and 13 are activated in response to redundant enable signal RE.

If, for example, a defective memory cell row is present in memory cell array 1, an address for designating the defective memory row is programmed in redundant fuse circuit 11. Programming is conducted by selectively fusing fuses in redundant fuse circuit 11. In addition, a fuse element (not shown) is fused in redundant enable circuit 10, and redundant enable signal RE is applied to redundant fuse circuit 11 as a result.

When row address signal RA for designating the defective memory cell row is applied, redundant fuse circuit 11 disables row decoder 2, and activates redundant row decoder 12. More specifically, redundant fuse circuit 11 applies an activation signal RRE to redundant row decoder 12 in response to row address signal RA. Redundant row decoder 12 activates a redundant word line (not shown) for accessing redundant memory cell row 8 in response to signal RRE. Accordingly, redundant memory cell row 8 is accessed in place of the defective memory cell row.

Accessing of redundant memory cell column 9 is conducted in a similar manner to the accessing of redundant memory cell row 8. More specifically, the address of a defective memory cell column is programmed in redundant fuse circuit 13. When a column address signal CA designating the defective memory cell column is applied, redundant fuse circuit 13 disables column decoder 3 and enables redundant column decoder 14. Thus, redundant memory cell column 9 is accessed instead of the defective memory cell column.

DRAM 100 further includes a redundant use detection circuit for detecting the presence/absence of use of a redundant circuit through an external terminal 38 (or 39). Redundant use detection circuit 15 is connected to receive a redundant use signal $\phi_{RR}$ output from redundant enable circuit 10. Redundant use detection circuit 15 receives an interlock signal $\phi k$ from clock signal generator 6 in another embodiment. Redundant use detection circuit 15 is connected to external terminal (or spare external terminal) 38 which is not used for detection of the presence/absence of use of a redundant circuit. Redundant use detection circuit 15 is connected to an address input terminal 39 in some cases.

DRAM 100 further includes a counter 22 for controlling switching in a multiplexer 20 in response to an output signal from clock signal generator 6. An I/O control circuit 26 responds to an output signal from clock signal generator 6 and controls a data input and a data output. DRAM 100 further includes internal voltage generation circuits 24, 25, . . .

Figure 2:
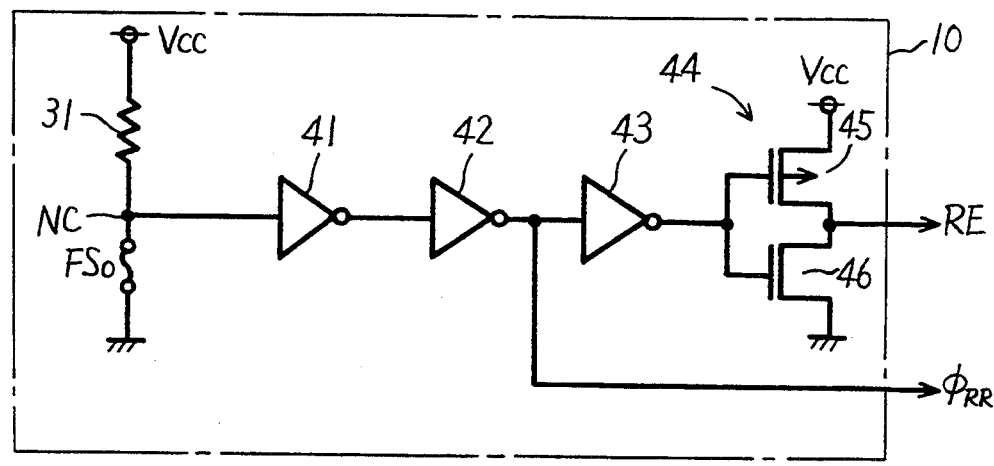
FIG. 2 is a diagram showing a redundant enable circuit shown in FIG. 1.

FIG. 2 is a diagram showing redundant enable circuit 10 shown in FIG. 1. Referring to FIG. 2, redundant enable circuit 10 includes a resistance element 31 and a fuse element FS0 connected in series between power supply potential Vcc and ground potential. Resistance element 31 has a high resistance value. Cascaded inverters 41 to 44 are connected to a common connection node NC of resistance element 31 and fuse element FS0. Redundant enable signal RE is output from inverter 44, while redundant use signal $\phi_{RR}$ is output from inverter 42.

When a redundant circuit is used, in other words when a defective memory cell row is present in memory cell array 1, fuse FS0 is fused by a laser beam. Redundant enable circuit 10 thus outputs a high level redundant enable signal RE. Meanwhile, if a redundant circuit is not used, in other words if a defective memory cell row is not present, fuse element FS0 is left. Accordingly, redundant enable circuit 10 outputs a low level redundant enable signal RE.

Figure 3:
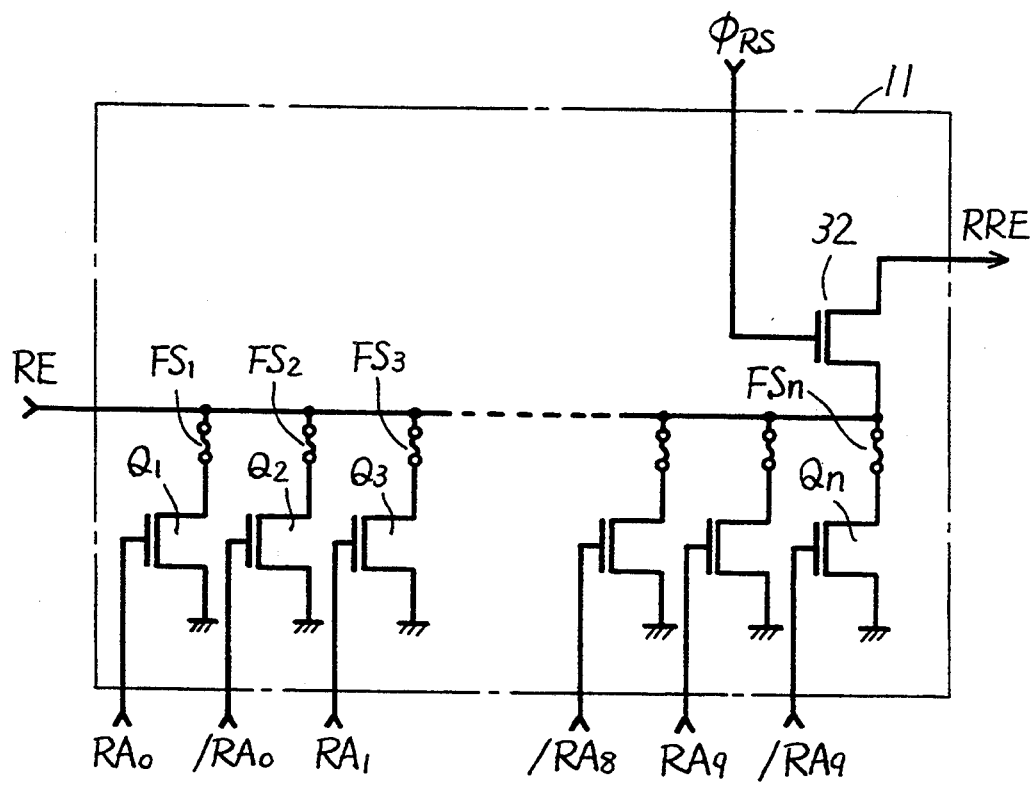
FIG. 3 is a diagram showing a redundant fuse circuit 11 shown in FIG. 1.

FIG. 3 is a diagram showing redundant fuse circuit 11 shown in FIG. 1. Referring to FIG. 3, redundant fuse circuit 11 for rows includes fuse elements FS1 to FSn for programming a defective memory cell row, NMOS transistors Q1 to Qn and 32. Transistor Q1 to Qn are connected to receive row address signals RA0, $\overline{RA0}$, . . . RA9, $\overline{RA9}$, respectively through a gate electrode. Each of transistors Q1 to Qn has a current driving capability $\beta$ (i.e. mutual conductance gm) larger than PMOS transistor 45 shown in FIG. 2. Transistor 32 receives a row selecting signal $\phi_{RS}$ applied through a gate electrode from clock signal generator 6. Transistor 32 outputs a signal RRE for enabling redundant row decoder 12.

If a defective memory cell row is present in memory cell array 1, fuse elements FS0 to FSn shown in FIGS. 2 and 3 are fused as follows. Fuse element FS0 in redundant enable circuit 10 is fused first. Thus, a high level redundant enable signal RE is applied to redundant fuse circuit 11.

Then, in view of the address of the defective memory cell row, fuse elements FS1 to FSn are selectively fused. More specifically, fuse elements FS1 to FSn are selectively fused so that output signal RRE rises only when a specific row address signal designating the defective memory cell row is applied. Signal RRE is output through transistor 32 to enable redundant row decoder 12.

Figure 24:
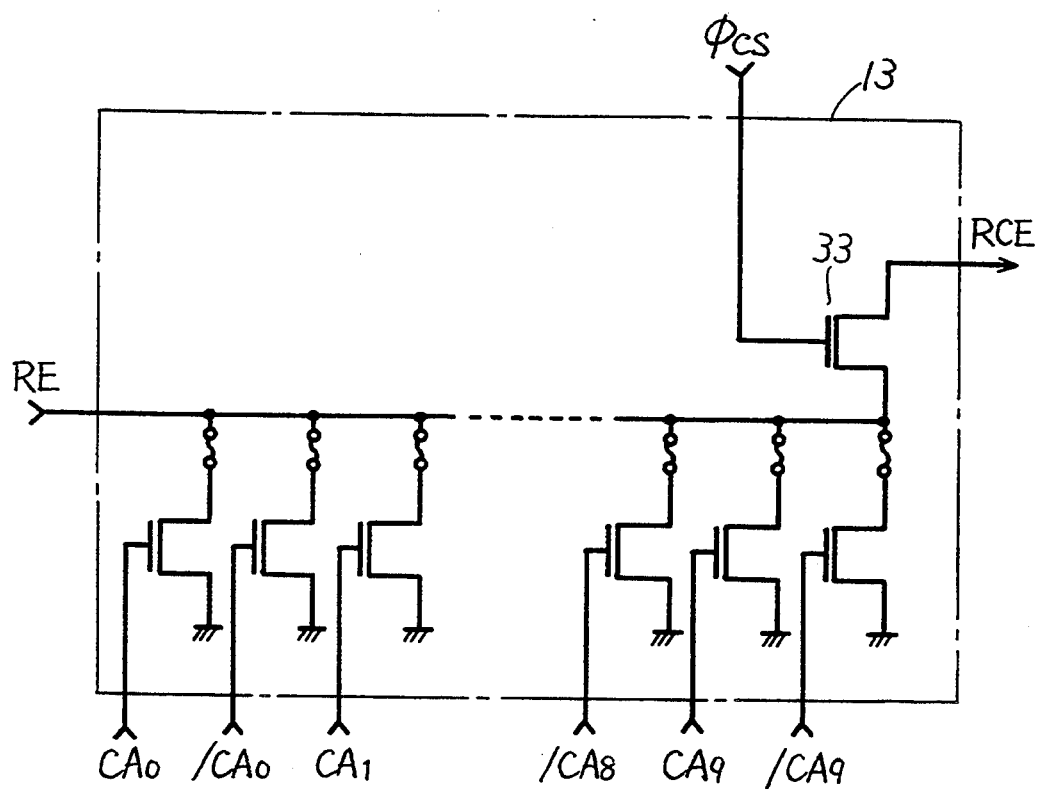
FIG. 24 is a diagram showing a redundant fuse circuit 12 shown in FIG. 1.

FIG. 24 is a diagram showing redundant fuse circuit 13 shown in FIG. 1. A redundant fuse circuit 13 for columns has a circuit configuration the same as redundant fuse circuit for rows 11 and operates in the same manner. As described above, at least one of redundant memory cell row 8 and redundant memory cell column 9 shown in FIG. 1 is provided in DRAM 100, and therefore at least one of redundant fuse circuits 11 and 13 shown in FIGS. 3 and 24 is similarly provided. An NMOS transistor 33 receives a column selection signal $\phi_{CS}$ through a gate electrode from clock signal generator 6. Redundant fuse circuit 13 outputs a redundant column decoder enable signal RCE.

Figure 4:
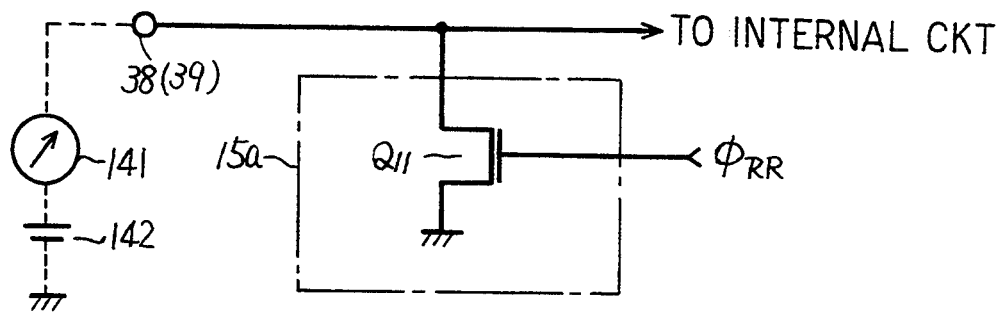
FIGS. 4 to 8 are diagrams showing examples of the redundant use detection circuit shown in FIG. 1.

FIG. 4 is a diagram showing one example of redundant use detection circuit 15 shown in FIG. 1. Redundant use detection circuit 15a shown in FIG. 4 can be applied as redundant use detection circuit 15 in DRAM 100 shown in FIG. 1.

Referring to FIG. 4, redundant use detection circuit 15a includes an NMOS transistor Q11 connected between external terminal 38 (or 39) and ground potential. Transistor Q11 has a gate electrode connected to receive redundant use signal $\phi_{RR}$ from redundant enable circuit 10 shown in FIG. 1.

If, for example, a redundant circuit is used, a high level signal $\phi_{RR}$ is applied. Transistor Q11 conducts in response to signal $\phi_{RR}$. High voltage source 142 is connected to external terminal 38 through amperemeter 141. Therefore, when a redundant circuit is used, current flows across transistor Q11, which current is detected by amperemeter 141. As a result, the use of the redundant circuit can be known through external terminal 38.

Meanwhile, if a redundant circuit is not used, a low level signal $\phi_{RR}$ is applied. Transistor Q11 is brought to a non-conduction state in response to signal $\phi_{RR}$. Accordingly, the absence of current flowing across transistor Q11 is detected by amperemeter 141. Consequently, one can know through external terminal 38 that a redundant circuit is not used.

Redundant use detection circuit 15a shown in FIG. 4 has the following advantage in terms of integration density. Assume that a high voltage of 5 V for redundant use detection is supplied through external terminal 38. In this case, the voltage of 5 V is supplied across the source-drain region of transistor Q11. In addition, when a redundant circuit is used, a redundant use signal $\phi_{RR}$ of 5 V is assumed to be applied. Assuming that a current of 10 $\mu$A flows across transistor Q11 while transistor Q11 conducts, 500 k$\Omega$ will be necessary as an on resistance for transistor Q11. In order to obtain such a resistance value using a resistance element, a dimension of 1 $\mu$m in width x about 500 $\mu$m in length will be necessary for an impurity diffusion region in a semiconductor substrate.

In contrast, if the resistance value is obtained by an NMOS transistor, assuming that current flowing across the transistor in its conduction state is 3 mA (for gate length=1 $\mu$m, gate width=10 $\mu$m), on-resistance of about 1.6 k$\Omega$ is obtained. In another example, for gate length=13 $\mu$m and gate width=2 $\mu$m, about 100 k$\Omega$ on resistance is obtained. More specifically, use of an NMOS transistor in place of diffusion resistance can form a transistor having a desired conduction resistance in a reduced occupied area on the semiconductor substrate.

Figure 5:
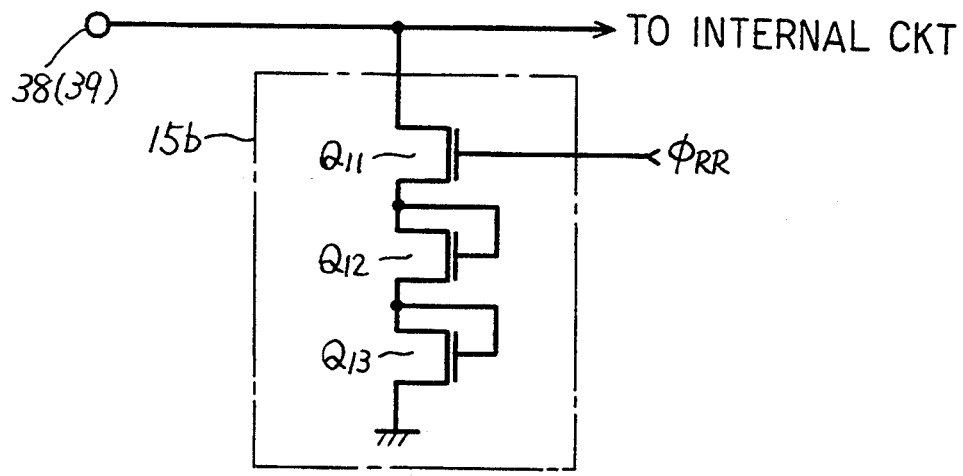

FIG. 5 is a diagram showing another example of redundant use detection circuit 15 shown in FIG. 1. Referring to FIG. 5, a redundant use detection circuit 15b includes NMOS transistors Q12, Q13, and Q14 connected in series between external terminal 38 (or 39) and ground potential. Transistor Q12 receives redundant use signal $\phi_{RR}$ through a gate electrode. Each of transistors Q13 and Q14 is connected in a diode-connected manner.

In operation, when a redundant circuit is being used, a high level signal $\phi_{RR}$ is applied. When high voltage for redundant use detection is supplied through external terminal 38, current flows across transistors Q11, Q12, and Q13. Accordingly, detection of the presence of such current permits use of the redundant circuit to be known. Meanwhile, a redundant circuit is not being used, a low level signal $\phi_{RR}$ is applied. Therefore, supply of high voltage to terminal 38 prevents current from flowing into circuit 15b, so that non-use of a redundant circuit can be detected.

The provision of transistors Q12 and Q13 each functioning as a diode element gives the following advantage. In a normal operation state, operation voltage lower than the above-described high voltage for redundant circuit detection is supplied to external terminal 38 (or 39). Transistors Q12 and Q13 are so designed that they do not conduct by such operation voltage even if transistor Q11 is in a conduction state. Accordingly, in a normal operation state of DRAM 100, current is prevented from flowing into redundant use detection circuit 15b through terminal 38 (or 39). As a result, increase of external load in another semiconductor integrated circuit device connected to external terminal 38 (or 39) can be prevented. The level of high voltage for redundant circuit detection is selected to turn on transistors Q12 and Q13 when transistor 11 is turned on.

Figure 6:
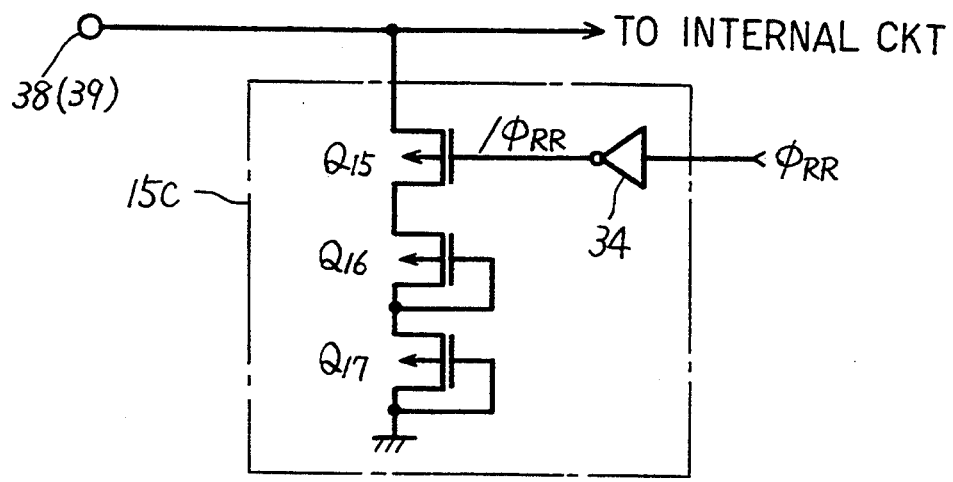

FIG. 6 is a diagram showing yet another example of redundant use detection circuit 15 shown in FIG. 1. Referring to FIG. 6, a redundant use detection circuit 15c includes PMOS transistors Q15, Q16, and Q17 connected in series between external terminal 38 (or 39) and ground potential. Transistor Q15 receives the inverse of redundant use signal $\phi_{RR}$ through inverter 38. Each of transistors Q16 and Q17 is provided in a diode-connected state. Redundant use detection circuit 15c shown in FIG. 6 operates in the same manner as circuit 15b shown in FIG. 5, and gives the same advantage.

Figure 7:
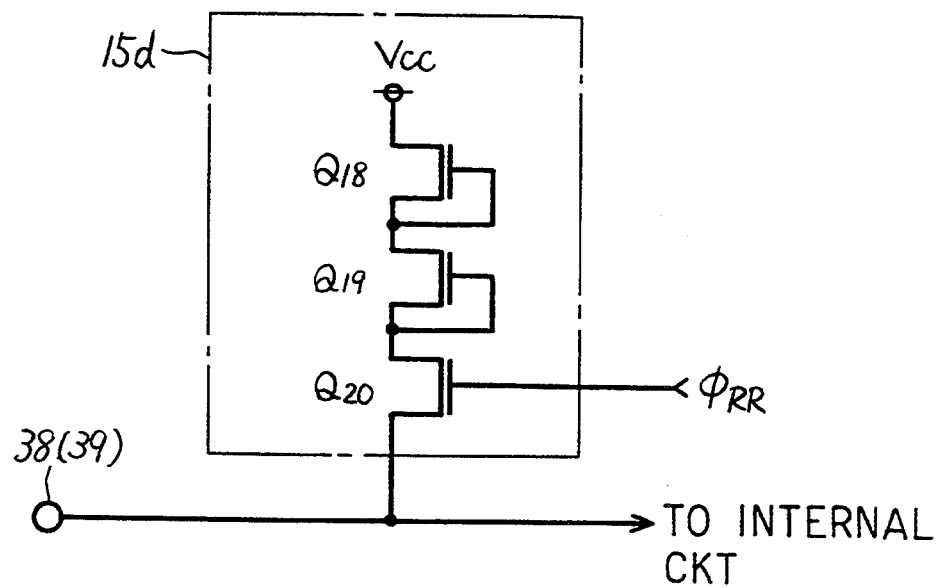
Figure 17:
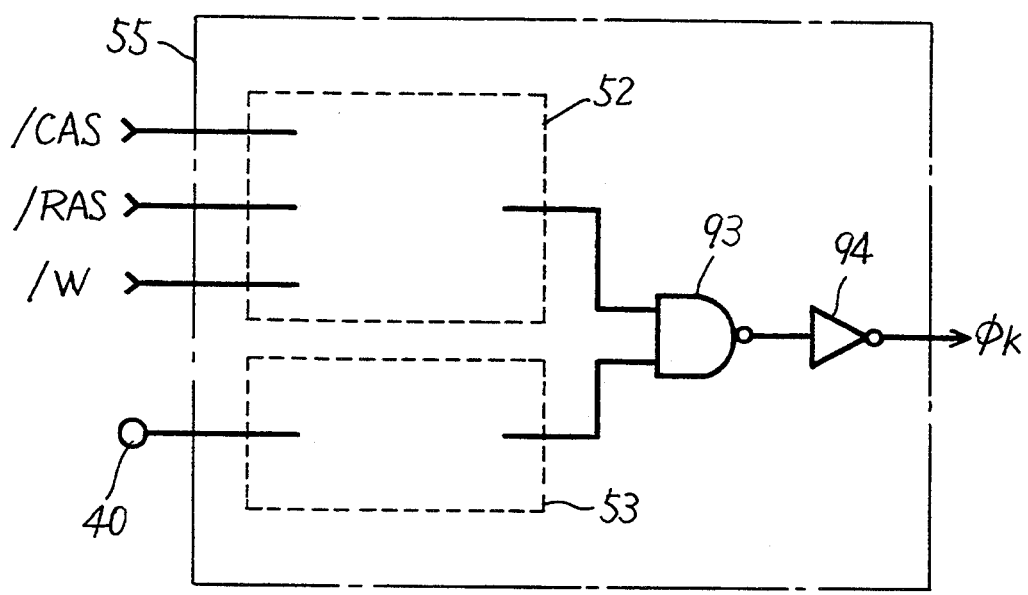
FIGS. 17 to 19 are diagrams showing other examples of an interlock signal generation circuit.

FIG. 7 is a diagram showing another example of redundant use detection circuit 15 shown in FIG. 1. Referring to FIG. 17, a redundant use detection circuit 15d includes NMOS transistors Q18, Q19, and Q20 connected in series between external terminal 38 (or 39) and ground potential Vcc. Transistor Q20 receives redundant use signal $\phi_{RR}$ through a gate electrode. When high voltage in excess of power supply potential Vcc for redundant use detection is applied through external terminal 38 and transistor Q20, each of transistors Q18 and Q19 functions as a diode element.

In operation, if a redundant circuit is being used, a high level signal $\phi_{RR}$ is applied. Since transistor Q20 conducts in response to signal $\phi_{RR}$, current flows into redundant use detection circuit 15d when high voltage is applied to terminal 38. The use of the redundant circuit can be known through external terminal 38 by detecting the presence of this current.

Figure 8:
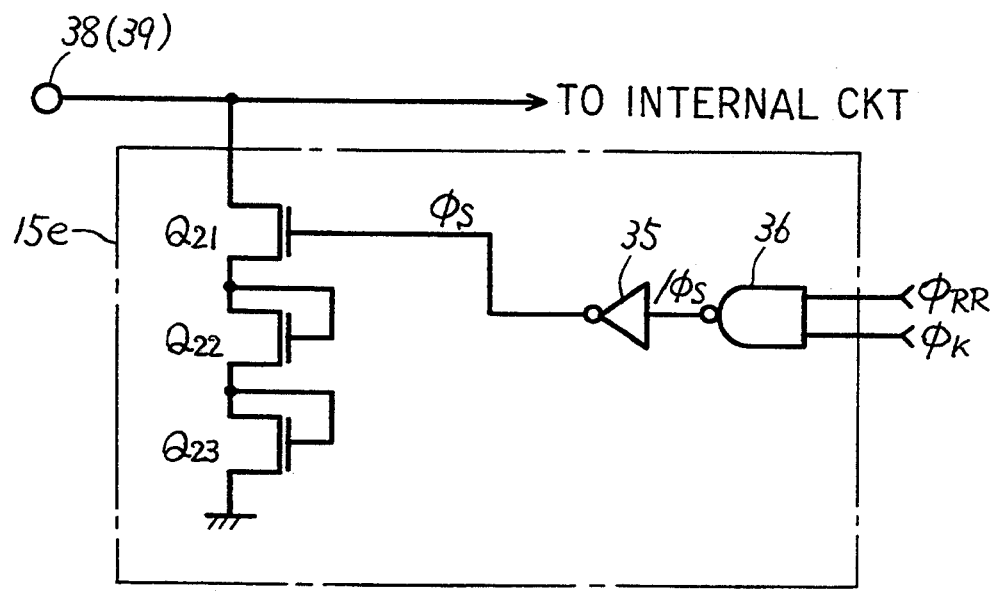

FIG. 8 is a diagram showing another example of redundant use detection circuit 15 shown in FIG. 1. Referring to FIG. 8, a redundant use detection circuit 15e includes NMOS transistors Q21, Q22, and Q23 connected in series between external terminal 38 (or 39) and ground potential, an inverter 35, and an NAND gate 36. NAND gate 36 receives redundant use signal $\phi_{RR}$ and interlock signal $\phi k$. The output signal of NAND gate 36 is inverted by inverter 35 and then applied to a gate electrode of transistor Q21 as a signal $\phi s$. Each of transistors Q22 and Q23 is connected in a diode-connected manner.

Generation of interlock signal $\phi k$ will be described later and interlock signal $\phi k$ attains a high level in a special mode (or redundant use detection mode) which is externally requested. Accordingly, NAND gate 36 outputs a low level signal $\phi s$ in response to a high level redundant use signal $\phi_{RR}$ (which indicates the use of a redundant circuit) and interlock signal $\phi k$. Signal $\phi s$ is inverted by inverter 35, and then applied to the gate electrode of transistor Q21.

Accordingly, transistor Q21 conducts when a redundant circuit is being used in the special mode (in other words redundant use detection mode) which is externally requested. In the redundant use detection mode, supply of high voltage for redundant use detection to external terminal 38 permits detection of the presence of current flowing into circuit 15e, and as a result the use of the redundant circuit can be known.

Use of interlock signal $\phi k$ in redundant use detection circuit 15e gives the following advantage. In other operation modes other than the redundant use detection mode, a low level interlock signal $\phi k$ is applied. Therefore, a low level signal $\phi s$ is applied to the gate electrode of transistor Q21. Consequently, transistor Q21 is turned off in the other operation modes. Thus, if operation voltage in other operation modes is applied to external terminal 38, current flowing into redundant use detection circuit 15e is not present. Therefore, undesirable current consumption can be prevented, while increase in external loads in other semiconductor devices connected to external terminal 38 can be prevented.

Interlock signal $\phi k$ can be generated in various manners in clock signal generator 6 shown in FIG. 1. In the following description, several interlock signal generation circuits provided in clock signal generator 6 will be described.

Figure 9:
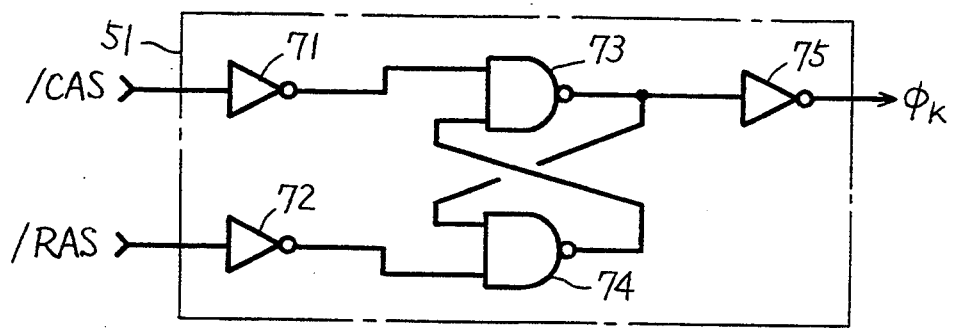
FIG. 9 is a diagram showing an example of an interlock signal generation circuit.

FIG. 9 is a diagram showing an example of the interlock signal generation circuit. Referring to FIG. 9, interlock signal generation circuit 51 includes inverters 71, 72, and 75, and NAND gates 73 and 74. Inverters 71 and 72 receive signals $\overline{CAS}$ and $\overline{RAS}$. Inverter 75 outputs interlock signal $\phi k$.

Figure 10:
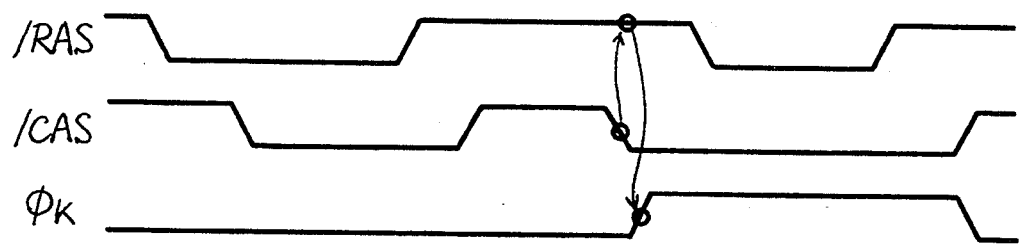
FIG. 10 is a timing chart for the interlock signal generation circuit shown in FIG. 9.

FIG. 10 is a timing chart for interlock signal generation circuit 51 shown in FIG. 9. Signals $\overline{RAS}$ and $\overline{CAS}$ are changed in the manner illustrated in FIG. 10, in order to define a redundant use detection mode. Referring to FIG. 10, during the period in which signal $\overline{RAS}$ is in a high level, signal $\overline{CAS}$ falls. Therefore, interlock signal $\phi k$ is pulled to a high level. Thus, the redundant use detection mode is defined in DRAM 100.

After the falling of signal $\overline{RAS}$, signal $\overline{RAS}$ is once again raised. In addition, signal $\overline{\phi k}$ falls in response to the rising of signal $\overline{CAS}$. The redundant use detection mode is canceled in response to the falling of signal $\phi k$.

Figure 11:
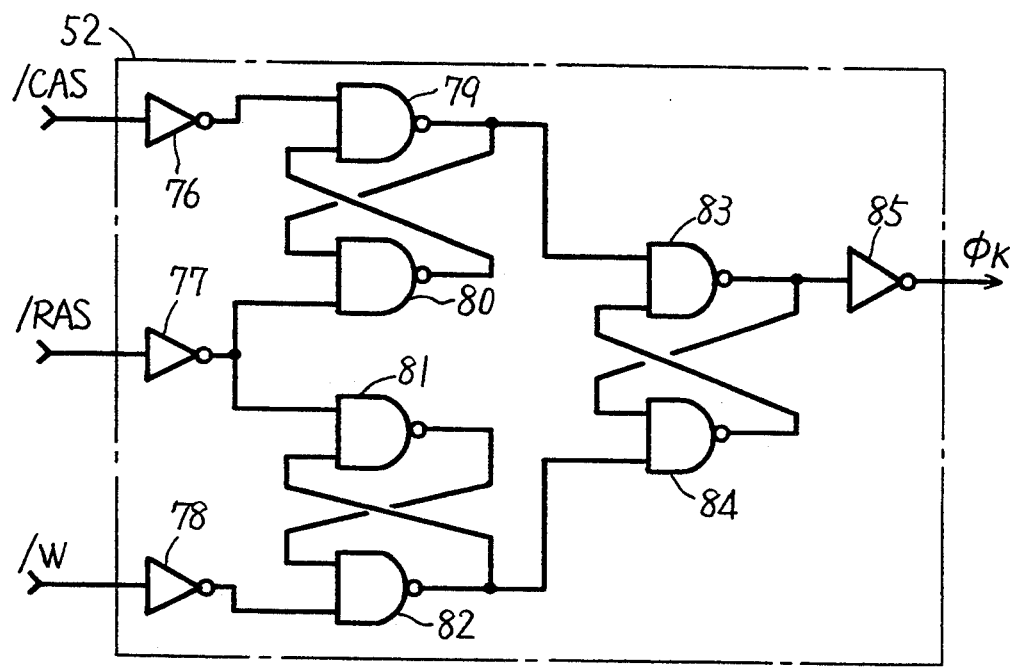
FIG. 11 is a diagram showing another example of an interlock signal generation circuit.

FIG. 11 is a diagram showing another example of an interlock signal generation circuit. Referring to FIG. 11, interlock signal generation circuit 52 includes inverters 76, 77, 78, and 85, and NAND gates 79, 80, 81, 82, 83, and 84. Inverters 76, 77, and 78 are connected to receive signals $\overline{CAS}$, $\overline{RAS}$, and $\overline{W}$. Interlock signal $\phi k$ is output through inverter 85.

Figure 12:
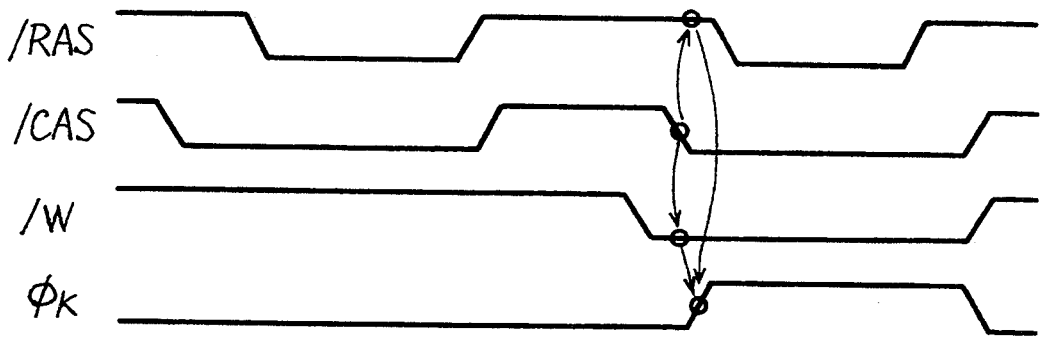
FIG. 12 is a timing chart for the interlock signal generation circuit shown in FIG. 11.

FIG. 12 is a timing chart for interlock signal generation circuit 52 shown in FIG. 11. In interlock signal generation circuit 52 shown in FIG. 11, signals $\overline{RAS}$, $\overline{CAS}$ and $\overline{W}$ are applied in the manner shown in FIG. 12, and thus the redundant use detection mode is defined during the period in which interlock signal $\phi k$ is at a high level.

Figure 13:
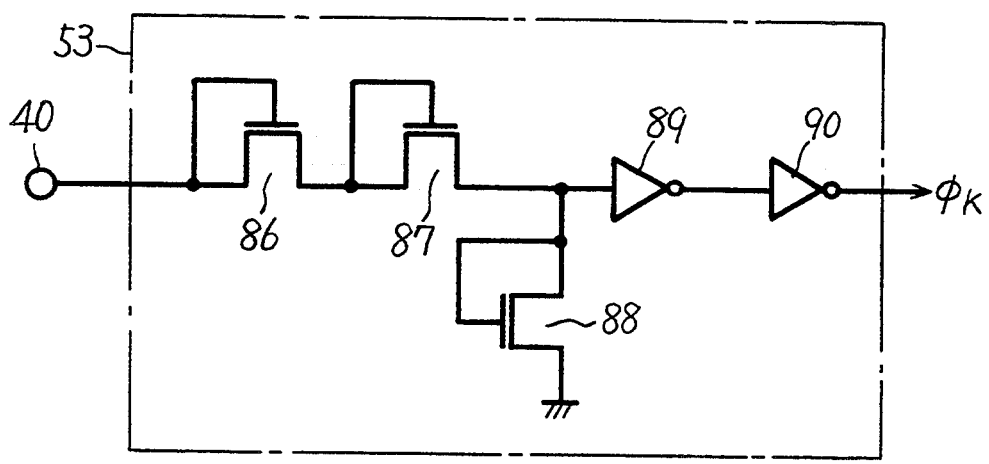
FIG. 13 is a diagram showing another example of an interlock signal generation circuits.

FIG. 13 is a diagram showing yet another example of the interlock signal generation circuit. Referring to FIG. 13, interlock signal generation circuit 53 includes NMOS transistors 86, 87, and 88, and inverters 89 and 90. Each of transistors 86, 87, and 88 is provided in a diode-connected manner. Transistor 86 is connected to a predetermined external terminal 40. External terminal 40 is selected from terminals other than the above-described external terminals 38 and 39 in DRAM 100.

Figure 14:
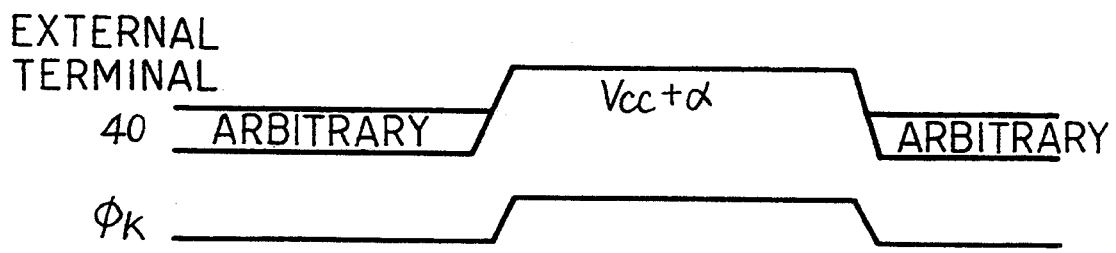
FIG. 14 is a timing chart for the interlock signal generation circuit shown in FIG. 13.

FIG. 14 is a timing chart-for interlock signal generation circuit 53 shown in FIG. 13. When the redundant use detection mode is requested, high voltage in excess of power supply voltage Vcc (=Vcc+α) is applied to terminal 40. Accordingly, transistor 89 operates in response to the high level input signal, and therefore a high level interlock signal φk is output. Meanwhile, when normal operation voltage is supplied to terminal 40, inverter 89 operates in response to a low level input signal. Therefore, in a normal operation mode, a low level interlock signal φk is output.

Figure 15:
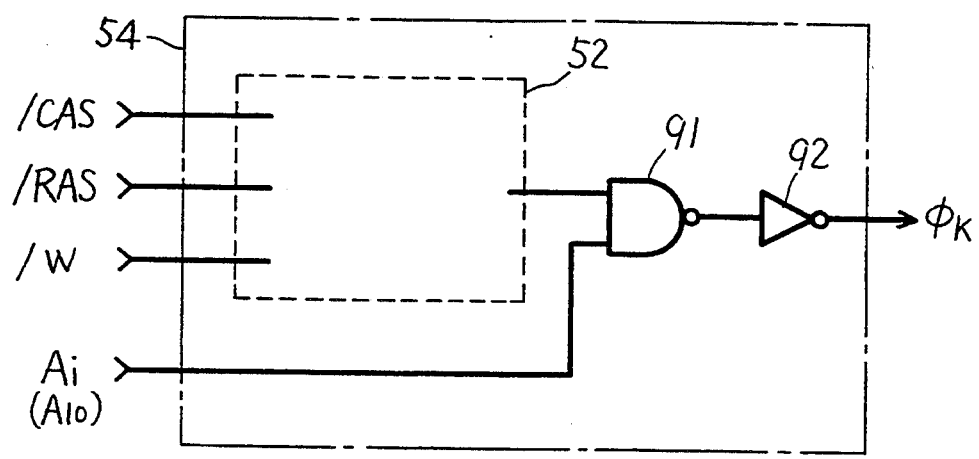
FIG. 15 is a diagram showing another example of an interlock signal generation circuit.

FIG. 15 is a diagram showing a still further example of the interlock signal generation circuit.

Referring to FIG. 15, an interlock signal generation circuit 54 includes interlock signal generation circuit 52 shown in FIG. 11, an NAND gate 91, and an inverter 92. NAND gate 91 is connected to receive the output signal of circuit 52 and an externally applied address signal Ai.

In a DRAM having a 4-megabit×1 scheme, for example, an address input terminal A10 is used for an address input terminal Ai. More specifically, since address input terminal A10 is not used in a test mode, it can be used as an input terminal for an externally applied control signal for redundant use detection. Meanwhile, in place of address input terminal A10, another terminal which is not used in the test mode can be used.

Figure 16:
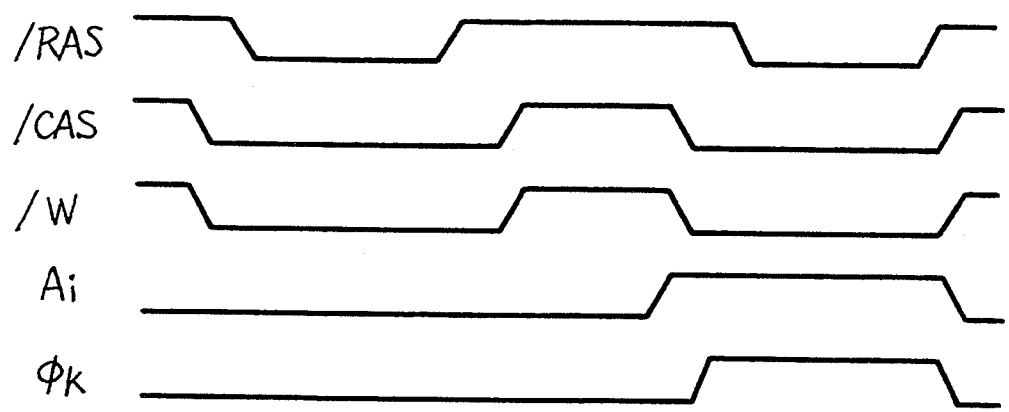
FIG. 16 is a timing chart for the interlock signal generation circuit shown in FIG. 15.

FIG. 16 is a timing chart for interlock signal generation circuit 54 show in FIG. 15. As illustrated in FIG. 16, interlock signal generation circuit 54 shown in FIG. 15 satisfies the conditions for signals $\overline{RAS}$, and $\overline{CAS}$, and $\overline{W}$ as well as the condition for the external control signal (Ai), and therefore can define the redundant use detection mode more strictly.

FIG. 17 is a diagram showing a still further example of interlock signal generation circuit. Referring to FIG. 17, interlock signal generation circuit 55 includes interlock signal generation circuit 52 shown in FIG. 11, interlock signal generation circuit 53 shown in FIG. 13, an NAND gate 93, and an inverter 94. NAND gate 93 receives the output signals of interlock signal generation circuits 53 and 52. Therefore, in circuit 55 shown in FIG. 17, when the conditions for signals $\overline{CAS}$, $\overline{RAS}$, and $\overline{W}$ are satisfied as well as high voltage is applied through external terminal 40, interlock signal φk is output. Thus, the redundant use detection mode can be more strictly defined.

Figure 18:
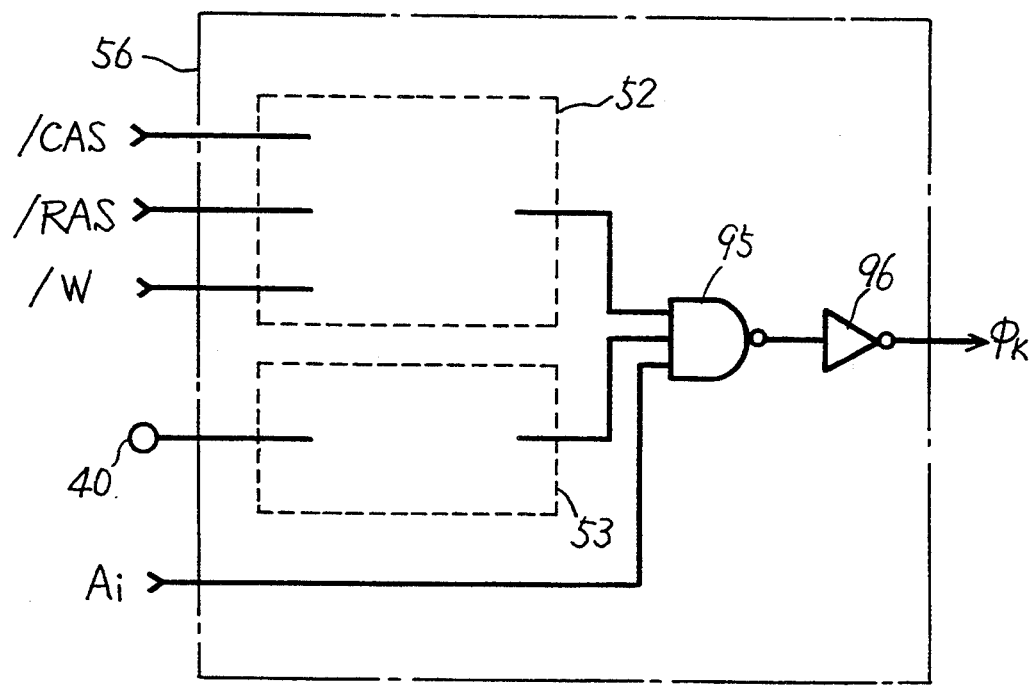

FIG. 18 is a diagram showing another example of interlock generation circuit. Referring to FIG. 18, interlock signal generation circuit 56 includes interlock signal generation circuit 52 shown in FIG. 11, interlock signal generation circuit 53 shown in FIG. 13, an NAND gate 95, and an inverter 96. -When compared to circuit 55 shown in FIG. 17, interlock signal generation circuit 56 shown in FIG. 18 additionally satisfies conditions for a control signal applied through address input terminal Ai. Accordingly, the redundant use detection mode can be more strictly defined.

Figure 19:
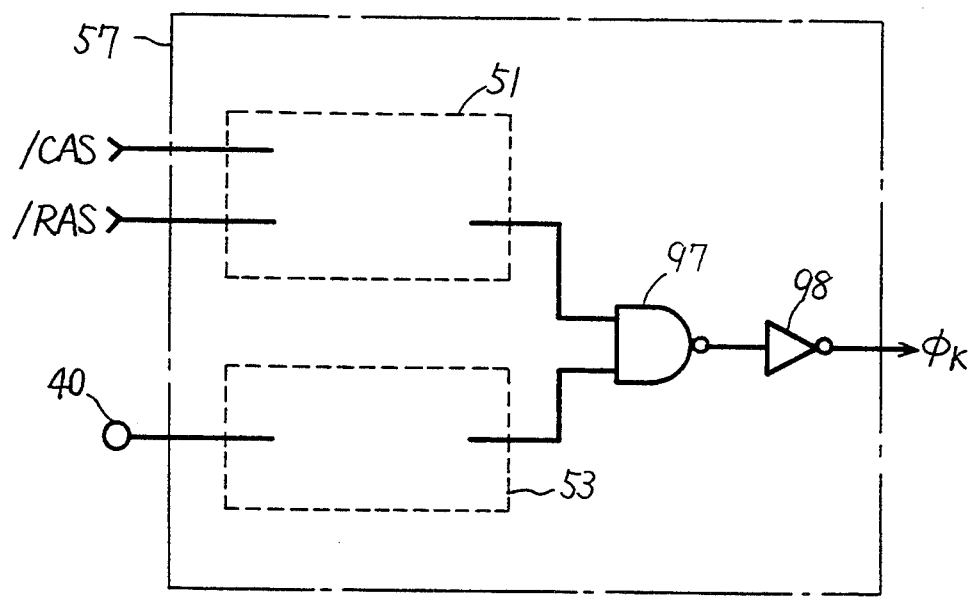
Figure 20:
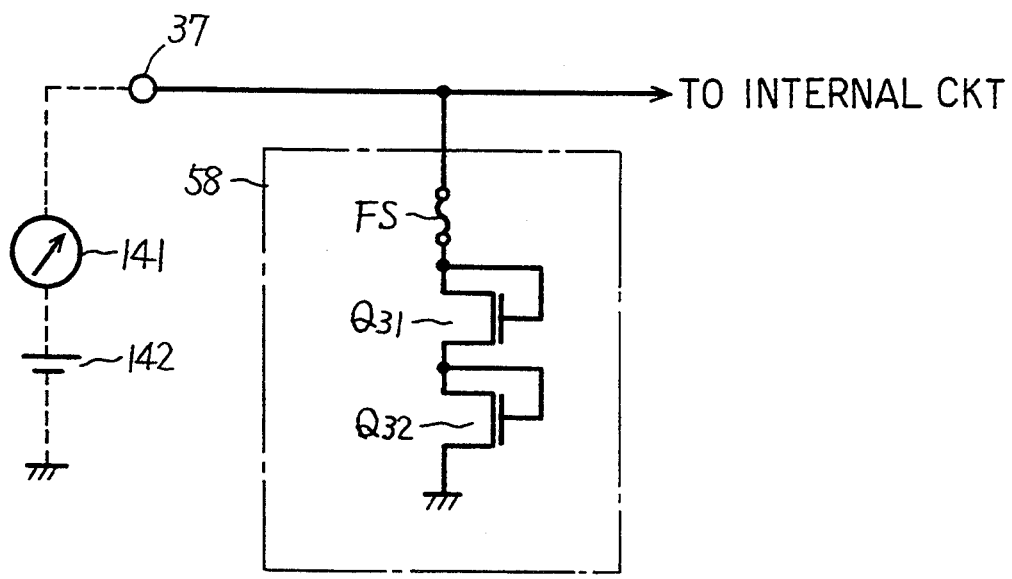
FIG. 20 is a diagram showing one example of a conventional redundant use detection circuit.
Figure 21:
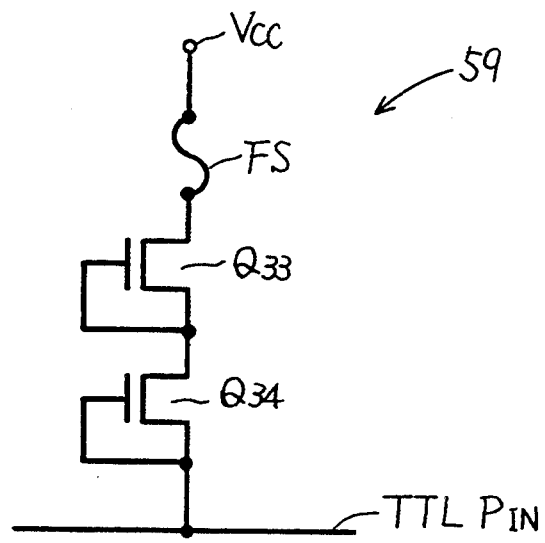
FIG. 21 is a diagram showing another example of a conventional redundant detection circuit.
Figure 22:
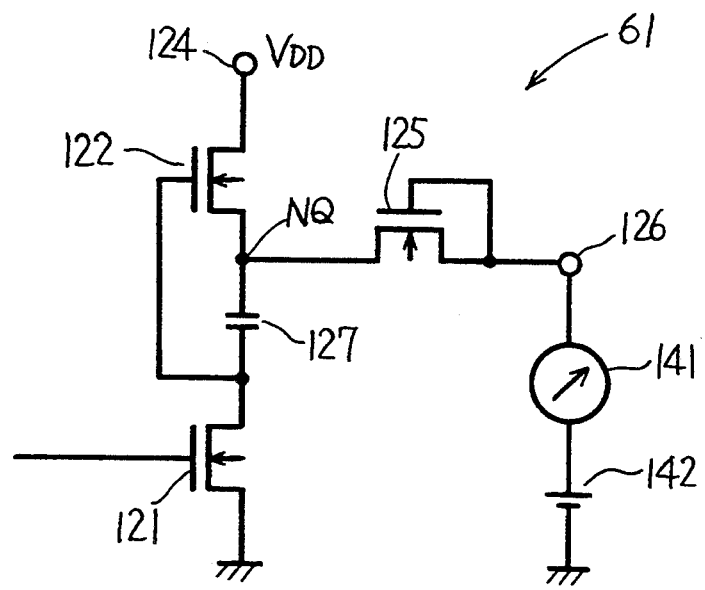
FIG. 22 is a diagram showing another example of a conventional redundant use detection circuit.

FIG. 19 is a diagram showing another example of the interlock signal generation circuit. Referring to FIG. 19, interlock signal generation circuit 57 includes interlock signal generation circuit 51 shown in FIG. 9, interlock signal generation circuit 53 shown in FIG. 13, an NAND gate 97, and an inverter 98. Accordingly, when the conditions for signals $\overline{CAS}$ and $\overline{RAS}$ are satisfied and high voltage is applied through external terminal 40 as well, interlock signal φk is output.

Thus, application of redundant use detection circuits 15a to 15d shown in FIGS. 4 to 7 in a semiconductor device such as DRAM 100, one can know use of a redundant circuit through external terminal 38 (or 39) without using any fuse element. Since any fuse element is not necessary, other wirings and/or circuits can be formed in a higher density in the periphery of redundant use detection circuits 15a to 15d, and therefore integration density in the semiconductor device can be improved.

Figure 23:
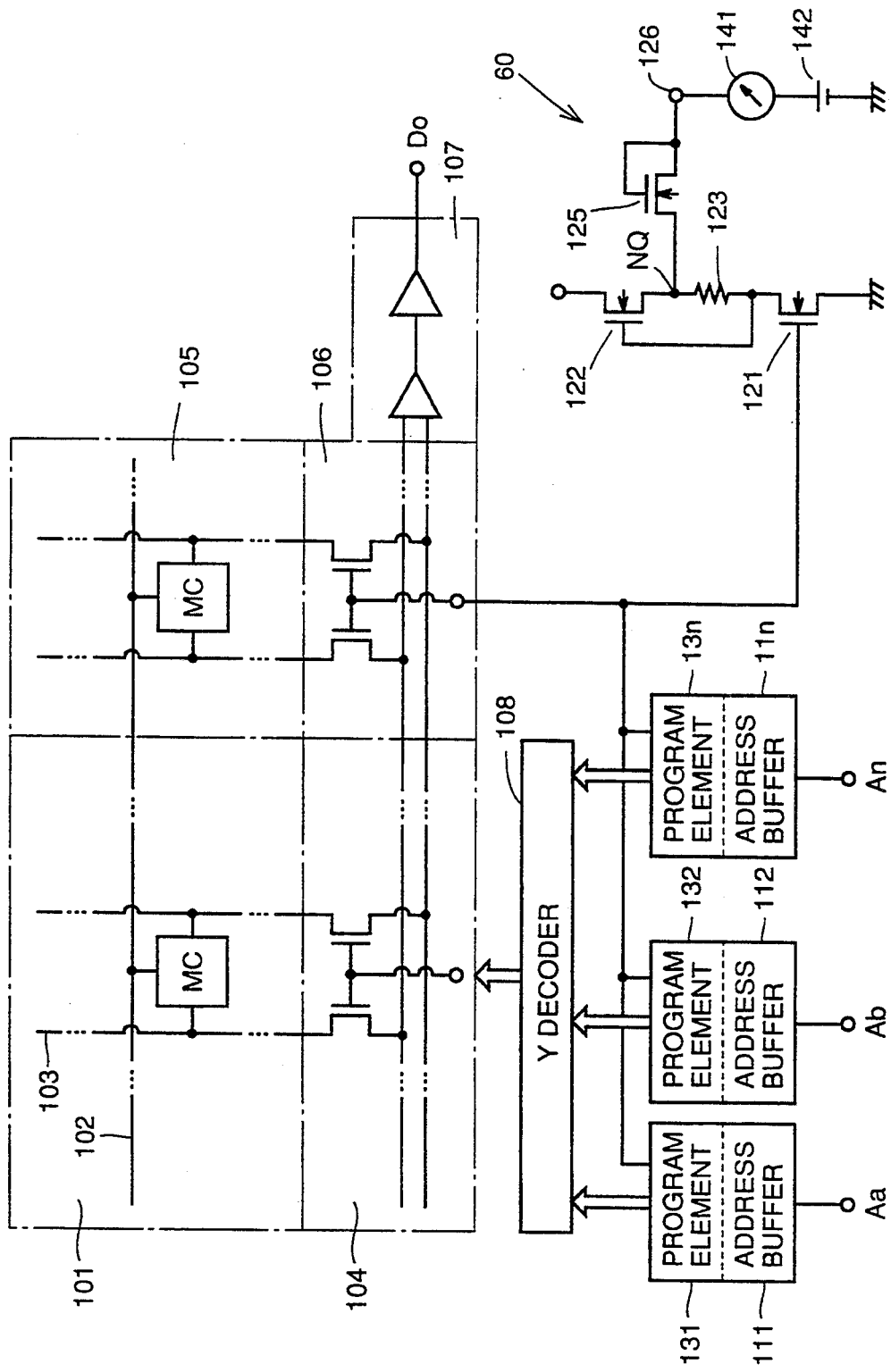
FIG. 23 is a diagram showing a semiconductor memory circuit using a conventional redundant use detection circuit.

In addition, redundant use signal φ$_{RR}$ applied to the redundant use detection circuit is output from redundant enable circuit 10 shown in FIG. 1, use of a redundant circuit can easily be detected. More specifically, since it is not necessary to change address signals Aa to An sequentially in order to obtain signal SR for selecting redundant memory cell column 105 as in the case of the conventional semiconductor memory shown in FIG. 23, time required for detecting redundant use can be reduced.

Furthermore, use of redundant use detection circuit 15e shown in FIG. 8 which operates in response to interlock signal φk defining the redundant use detection mode prevents current from flowing into redundant use detection circuit 15e in modes other than the redundant use detection modes. As a result, increase in current consumption can be prevented, and therefore increase in loads in other semiconductor integrated circuit devices connected to the external terminal can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array including a plurality of memory cells arranged in rows and columns;
   program means for programming an address of a defect in said memory cell array and transmitting an output signal indicative of said address;
   redundant circuit means responsive to the output signal from said program means for functionally replacing said defect in said memory cell array;
   enabling means for transmitting a first output signal to enable said program means and for transmitting a second output signal indicative of the enabling of said program means, wherein said program means is activated in response to said first output signal;
   an external terminal; and
   switching circuit means connected between said external terminal and a first power supply source for conducting power from said power supply source to said external terminal in response to the second output signal from said enabling means.

2. A semiconductor memory device as recited in claim 1, wherein said program means includes defective address program means for programming the address of at least one of a defective row and a defective column in said memory cell array.

3. A semiconductor memory device as recited in claim 2, wherein
said first output signal from said enabling means is an enabling potential for enabling said program means,
said defective address program means includes a plurality of program element pairs connected between said enabling means and the first power supply source, and
each of said plurality of program element pairs (i) includes a fuse element and a switching element connected in series between said enabling means and the first power supply source, and (ii) conducts said enabling potential in response to an externally applied address signal.

4. A semiconductor memory device as recited in claim 1, wherein
said switching circuit means includes a switching element and diode elements connected in series between said external terminal and the first power supply source, and
said switching element conducts power in response to the second output signal from said enabling means.

5. A semiconductor memory device as recited in claim 1, wherein
said enabling means includes resistor means and a fuse element connected in series between said first power supply source and a second power supply source, and
said switching circuit means conducts power in response to the second output signal from said enabling means provided through a common connection node of said resistor means and said fuse element.

6. A semiconductor memory device as recited in claim 1, wherein
said defect includes a defective row circuit in said memory cell array, and
said redundant circuit means includes a redundant row circuit responsive to the output signal from said program means for functionally replacing said defective row circuit in said memory cell array.

7. A semiconductor memory device as recited in claim 1, wherein
said defect includes a defective column circuit in said memory cell array, and
said redundant circuit means includes a redundant column circuit responsive to the output signal from said program means for functionally replacing said defective column circuit in said memory cell array.

8. A semiconductor memory device as recited in claim 1, wherein
said external terminal includes an input terminal for receiving an externally applied address signal representing an address to be replaced in said memory cell array and for transmitting an output signal indicative of said address to said redundant circuit means.

9. A semiconductor memory device as recited in claim 1, further comprising a redundant use detection mode defining means responsive to an externally applied state control signal for defining a redundant use detection mode in said semiconductor memory device and transmitting an output signal corresponding to said control signal, wherein
said switching circuit means conducts power in response to the output signal from said redundant use defection mode defining means and only in the redundant use detection mode.

10. A semiconductor memory device as recited in claim 9, wherein
said redundant use detection mode defining means includes first detection means responsive to first and second externally applied state control signals for detecting designation of said redundant use detection mode.

11. A semiconductor memory device as recited in claim 10, wherein
said first and second state control signals are an externally applied row address strobe signal and an externally applied column address strobe signal, respectively.

12. A semiconductor memory device as recited in claim 10, wherein
said first detection means detects designation of said redundant use detection mode in response to supply of an externally applied voltage.

13. A semiconductor memory device as recited in claim 12, wherein said externally applied voltage is higher in magnitude than a voltage supplied to said first detection means during other than said redundant use detection mode.

14. A semiconductor memory device as recited in claim 10, wherein
said first detection means detects designation of said redundant use detection mode in response to a third externally applied state control signal.

15. A semiconductor memory device as recited in claim 14, wherein
said third state control signal is an externally applied write enable signal.

16. A semiconductor memory device as recited in claim 9, wherein
said redundant use detection mode defining means includes detection means responsive to supply of an externally applied voltage for detecting designation of said redundant use detection mode.

17. A semiconductor memory device as recited in claim 16, wherein said externally applied voltage is higher in magnitude than a voltage supplied to said detection means during other than said use detection mode.

18. A semiconductor memory device as recited in claim 1, wherein
said semiconductor memory device is a dynamic random access memory.

19. A semiconductor device, comprising:
program means for programming a position of a defective circuit within said semiconductor device and transmitting an output signal indicative of said position;
redundant circuit means responsive to the output signal from said program means for functionally replacing said defective circuit;
enabling means for transmitting a first output signal to enable said program means and for transmitting a second output signal indicative of the enabling of said program means, wherein said program means is activated in response to said first output signal;
an external terminal; and
switching circuit means connected between said external terminal and a power supply source for conducting power from said power supply source to said external terminal in response to the second output signal from said enabling means.

* * * * *